(12) United States Patent
Sakurada et al.

(10) Patent No.: US 7,629,019 B2
(45) Date of Patent: Dec. 8, 2009

(54) METHOD FOR FORMING WIRING PATTERN, WIRING PATTERN, AND ELECTRONIC APPARATUS

(75) Inventors: Kazuaki Sakurada, Suwa (JP); Noboru Uehara, Shimosuwa-machi (JP); Tsuyoshi Shintate, Matsuyama-machi (JP)

(73) Assignee: Seiko Epson Corporation, Tokyo (JP)

( * ) Notice: Subject to any disclaimer, the term of this patent is extended or adjusted under 35 U.S.C. 154(b) by 860 days.

(21) Appl. No.: 11/196,319

(22) Filed: Aug. 4, 2005

(65) Prior Publication Data

US 2006/0065955 A1 Mar. 30, 2006

(30) Foreign Application Priority Data

Sep. 28, 2004 (JP) ............................. 2004-282224

(51) Int. Cl.
*B05D 5/12* (2006.01)
(52) U.S. Cl. .................. 427/96.1; 427/98.4; 427/427.1; 427/427.3
(58) Field of Classification Search ................ 427/96.1, 427/98.4, 427.1, 427.3
See application file for complete search history.

(56) References Cited

U.S. PATENT DOCUMENTS 5,132,248 A 7/1992 Drummond et al.
6,402,280 B2 * 6/2002 Kneezel et al. ................ 347/15
7,198,821 B2 4/2007 Furusawa et al.
2004/0000429 A1 1/2004 Furusawa et al.
2004/0081768 A1 * 4/2004 Furusawa et al. ........... 427/421
2004/0196321 A1 * 10/2004 Eguchi et al. ................. 347/12
2005/0001866 A1 * 1/2005 Eguchi et al. ................. 347/15
2005/0031836 A1 * 2/2005 Hirai .......................... 428/209

FOREIGN PATENT DOCUMENTS

| JP | A-11-163499 | 6/1999 |
| JP | A-2003-309369 | 10/2003 |
| JP | A-2003-317553 | 11/2003 |
| JP | A-2003-324266 | 11/2003 |
| JP | A-2004-000932 | 1/2004 |

* cited by examiner

*Primary Examiner*—Binh X Tran
(74) *Attorney, Agent, or Firm*—Oliff & Berridge, PLC

(57) ABSTRACT

A method for forming a wiring pattern in which a plurality of electrical wirings deposited onto a substrate is conductively connected with each other through a plurality of conductive posts, the method including relatively moving a discharge head having a plurality of nozzles and a substrate in a predetermined direction while discharging droplets from predetermined nozzles among the plural nozzles to form the plural conductive posts, wherein, in the orthogonal direction of the above-referenced predetermined direction, the interval among the plural nozzles "a" and the interval among the plural conductive posts "b" satisfy an equation "b=m×a" ("m" may be any positive integer).

4 Claims, 9 Drawing Sheets

| (S) | (STEP OPERATION) | (APPARATUS) | (CONDITION) |
|---|---|---|---|
| 1 | CLEAN SUBSTRATE | EXCIMER UV (WAVELENGTH 172nm) | 300sec |
| 2 | DRAW BANK FOR 0th LAYER INSULATOR FILM | DROPLET DISCHARGE APPARATUS | - |
| 3 | UV HARDEN BANK | UV (WAVELENGTH 365nm) | 4sec |
| 4 | DRAW 0th LAYER INSULATOR FILM | DROPLET DISCHARGE APPARATUS | - |
| 5 | UV HARDEN | UV (WAVELENGTH 365nm) | 60sec |
| 6 | CONTROL CONTACT ANGLE FOR 1st LAYER Ag | EXCIMER UV (WAVELENGTH 172nm) | 15sec |
| 7a | DRAW 1st LAYER Ag WIRING | DROPLET DISCHARGE APPARATUS | - |
| 7b | PRELIMINARILY DRY Ag | DRY AIR | - |
| 8a | DRAW 1st LAYER Ag POST | DROPLET DISCHARGE APPARATUS | - |
| 8b | PRELIMINARILY DRY Ag | DRY AIR | - |
| 9 | REPEAT S8a AND S8b | | - |
| 10 | FULLY BAKE Ag | HOT PLATE | 150 degrees centigrade × 30min |
| 11 | CONTROL CONTACT ANGLE FOR 1st LAYER INSULATOR FILM | EXCIMER UV (WAVELENGTH 172nm) | 60sec |
| 12 | DRAW 1st LAYER INSULATOR FILM AROUND Ag | DROPLET DISCHARGE APPARATUS | - |
| 13 | LYOPHILIC TREATMENT | EXCIMER UV (WAVELENGTH 172nm) | 10sec |
| 14 | UV HARDEN | UV (WAVELENGTH 365nm) | 4sec |
| 15 | 1st LAYER INSULATOR FILM | DROPLET DISCHARGE APPARATUS | - |
| 16 | UV HARDEN | UV (WAVELENGTH 365nm) | 60sec |
| | REPEAT S6 - S16 FOR ADDITIONAL LAYERS | | |

FIG. 3

METHOD FOR FORMING WIRING PATTERN, WIRING PATTERN, AND ELECTRONIC APPARATUS

This application claims the benefit of Japanese Patent Application No. 2004-282224, filed Sep. 28, 2004. The entire disclosure of the prior application is hereby incorporated by reference herein in its entirety.

BACKGROUND OF THE INVENTION

1. Technical Field

The present invention relates to a method for forming a wiring pattern, a wiring pattern, and an electronic apparatus.

2. Related Art

A wiring pattern composing an electronic apparatus is formed by using, for example, lithography. However, lithography requires huge facilities, such as a vacuum system, and complicated processes. Besides, the manufacturing cost is high because the yield rate is only a few percent and the bulk of material must be thrown out. Further, there is a limit to the refining of a wiring pattern.

Therefore, as an alternative process to lithography, a method for discharging a droplet containing a functional material onto a substrate to draw and form a wiring pattern directly onto the substrate (a droplet discharge system) is considered. In the method, first, a droplet in which conductive microparticles are dispersed is discharged onto a substrate from a droplet discharge head to form a liquid line. Then, the liquid line is baked with heat treatment or laser irradiation or the like to form a wiring pattern (refer, for example, to the specification of the U.S. Pat. No. 5,132,248). According to the droplet discharge system, the manufacturing process is simplified, and the manufacturing cost can be lowered due to a high yield rate. Further, the refining of a wiring pattern is easily realized.

Multilayering as well as refining of wiring patterns is important to downsize electronic apparatuses. To multilayer wiring patterns, electrical wirings are deposited via interlayer insulator films, the electrical wirings on the plural layers being conductively connected to each other through conductive posts.

The above-referenced conductive posts need to be formed with an appropriate height to pierce the interlayer insulator films. Therefore, plenty of droplets need to be discharged by a droplet discharge system to form a post with an appropriate height. However, discharging plenty of droplets at a time is not sufficient to achieve a needed height for a post. Rather, there is a possibility that it generates a post that is too large in diameter, causing a short circuit between adjacent electrical wirings or between adjacent conductive posts. Therefore, the establishment of a method for forming a conductive post with an appropriate height by a droplet discharge system is desired.

SUMMARY

An advantage of the invention is to provide a method for forming a wiring pattern that is suitable for forming a conductive post. Another advantage of the invention is to provide a wiring pattern and an electronic apparatus that realize a low manufacturing cost and a highly reliable electrical connection.

Therefore, a first aspect of the invention is to provide a method for forming a wiring pattern in which a plurality of electrical wirings deposited onto a substrate is conductively connected with each other through a plurality of conductive posts. The method includes relatively moving a discharge head having a plurality of nozzles and the substrate in a predetermined direction while discharging droplets from predetermined nozzles among the plural nozzles to form the plural conductive posts. Here, in the orthogonal direction of the above-referenced predetermined direction, the interval among the plural nozzles "a" and the interval among the plural conductive posts "b" must satisfy an equation "b=m×a" ("m" may be any positive integer).

According to the method, due to the requirement that the interval among the plural conductive posts is equal to integral multiples of the interval among the plural nozzles, a droplet discharge process can be simplified. Specifically, in the relative movement of the discharge head and the substrate, the droplets can be placed in a single relative movement on each of the positions on which the plural conductive posts to be formed, because, due to the requirement, once a conductive post forming position is placed on a moving axis of one of the plural nozzles, other conductive post forming positions are also placed on moving axes of the other nozzles. Therefore, the relative movement can be done more efficiently, simplifying a droplet discharge process.

In the method for forming a wiring pattern, the discharging and the preliminary drying of droplets are repeated so that the plural conductive posts may be deposited. Multilayered posts are formed by the repetition of the discharging and the preliminary drying of droplets. Then, the laminated structure ensures an appropriate height for a post to be formed. Further, the method suppresses an increase of processing time involved with the repeating of droplets discharging, because there is little waste in the relative movement of the discharge head and the substrate as described above.

Here, the method includes forming of liquid lines to form the plural electrical wirings, the plural conductive posts being deposited on the liquid lines. By forming the posts on the liquid lines, both can be easily coalesced on the interface. Then, by simultaneously baking the coalesced liquid lines and posts, the electrical wirings and the conductive posts can be integrally formed. As a result, the occurrence of cracks on the interface between the electrical wirings and the conductive posts can be prevented, making it possible to form a wiring pattern that has a highly reliable conductive connection.

The method of forming a wiring pattern also includes setting up on the substrate a plurality of unit areas that is subdivided in a lattice pattern for locating a droplet discharge position. Here, it is preferable that the unit areas are set up so that, in the orthogonal direction of the above-referenced predetermined direction, the interval among the plural nozzles "a" and the width of the unit area "c" satisfy an equation "c=a/n" ("n" may be any positive integer). Thus, the pattern design can be simplified.

A wiring pattern according to an aspect of the invention is formed using the above-referenced method for forming a wiring pattern. The wiring pattern realizes a low manufacturing cost and a highly reliable electrical connection.

An electronic apparatus according to an aspect of the invention includes the above-referenced wiring pattern. According to the electronic apparatus, a small electronic apparatus that realizes a low manufacturing cost and a highly reliable electrical connection can be provided, because it includes a refined wiring pattern that realizes a low manufacturing cost and a highly reliable electrical connection.

BRIEF DESCRIPTION OF THE DRAWINGS

The invention will be described with reference to the accompanying drawings, wherein like numbers refer to like elements, and wherein:

FIG. 3 is an operation sheet of a method for forming a wiring pattern according to the embodiment;

DESCRIPTION OF THE EMBODIMENTS

Figure 1:
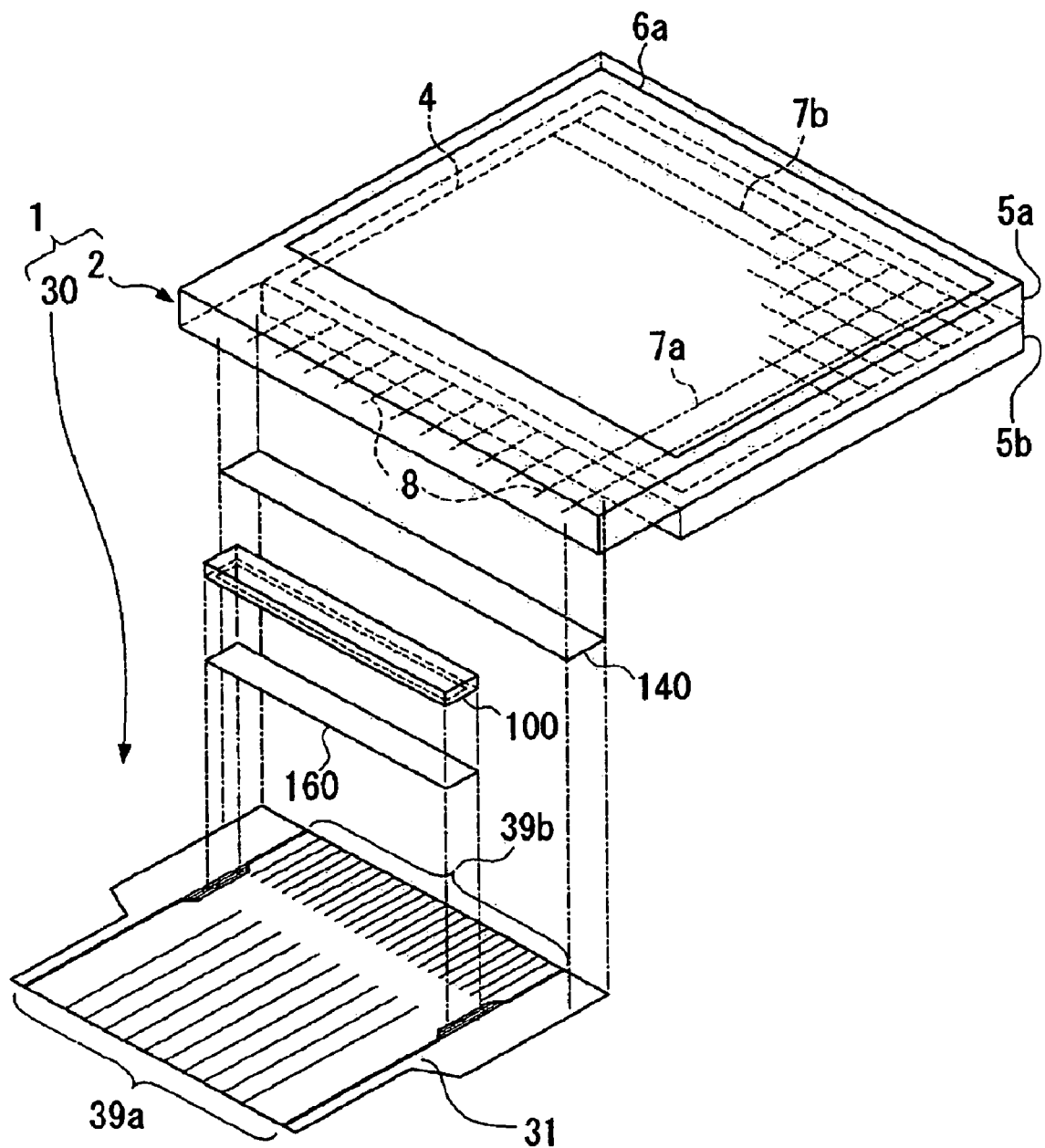
FIG. 1 is an exploded oblique diagram of a liquid crystal module with a COF structure.

Embodiments of the invention will now be described with reference to the drawings. In the drawings to be referred below, scale sizes of the components are accordingly changed so that the components can be drawn in recognizable sizes.

FIG. 1 is an exploded oblique diagram of a liquid crystal module with a COF (Chip On Film) structure. In the present embodiment, a method for forming a wiring pattern on a Flexible Printed Circuit 30 (hereinafter, simply referred to as an "FPC") will be described as an example. FPC 30 includes a flexible film substrate 31, on the surface of which electrical wiring patterns 39a and 39b are formed. As is described later in detail, in the liquid crystal module 1 shown in FIG. 1, FPC 30 is connected to an edge of a liquid crystal panel 2, and a liquid crystal driving IC 100 is installed on the surface of FPC 30. Then, a driving signal is output to the liquid crystal panel 2 from the liquid crystal driving IC 100 via FPC 30 to display images on the liquid crystal panel 2.

(A Wiring Pattern)

Figure 2A:
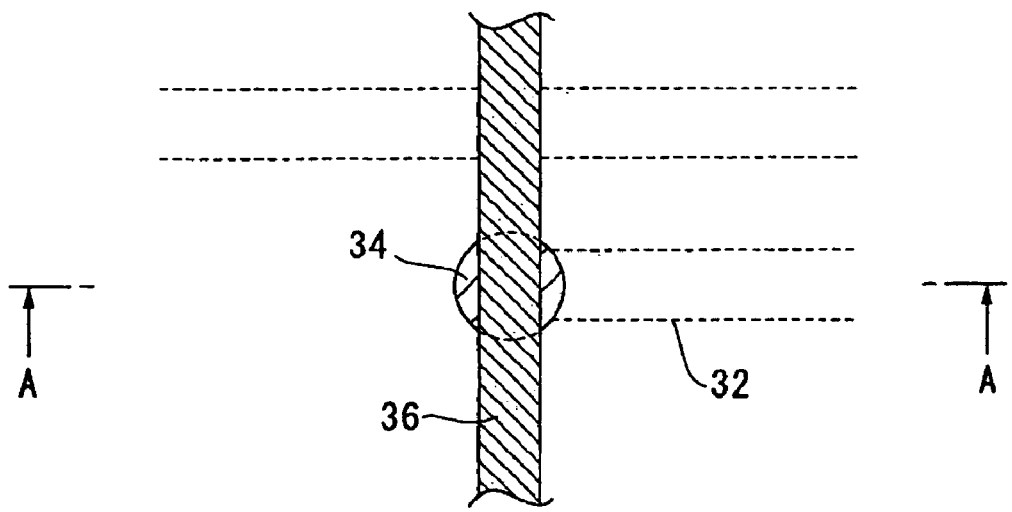
FIGS. 2A and 2B are diagrams explaining a wiring pattern according to the embodiment.
Figure 2B:
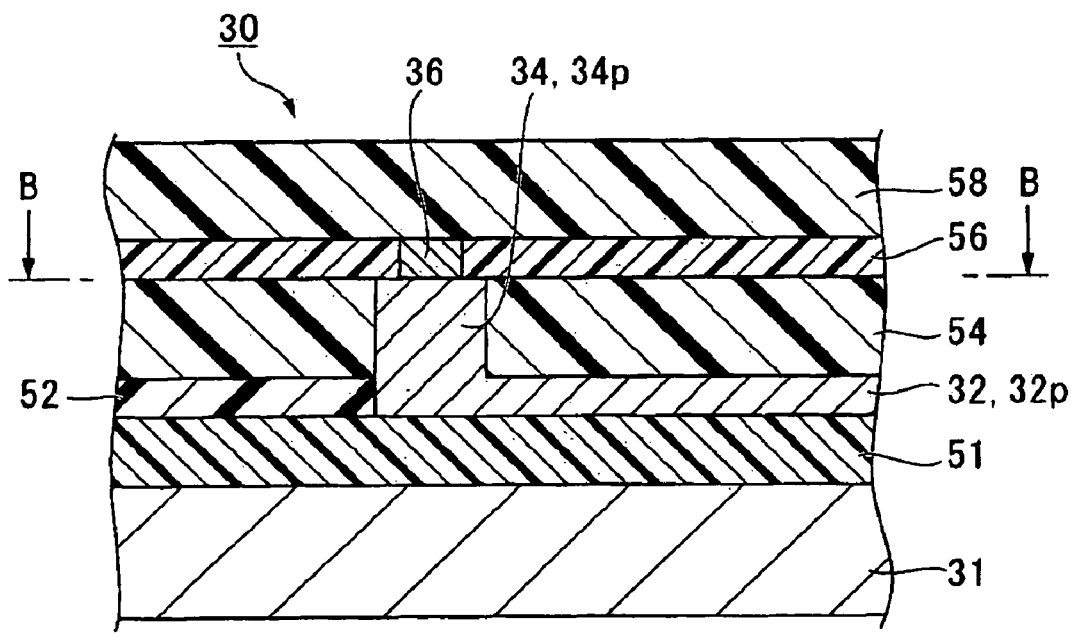

FIGS. 2A and 2B are diagrams explaining a wiring pattern according to an embodiment of the invention and enlarged views of a wiring pattern forming part on the FPC. Here, FIG. 2A is a two-dimensional sectional view of FIG. 2B on the B-B line while FIG. 2B is a two-dimensional sectional view of FIG. 2A on the A-A line. As shown in FIG. 2B, in the wiring pattern of the embodiment, a lower layer electrical wiring 32 and an upper layer electrical wiring 36 are deposited via an interlayer insulator film 54. Note that the wiring pattern described below is only an example and the invention is applicable also for other wiring patterns than the one in the example.

As shown in FIG. 2B, FPC 30 includes a flexible film substrate 31 composed of polyimide or the like. A base insulator film 51 is formed on the surface of the film substrate 31. The base insulator film 51 is composed of an electric insulating material in which ultraviolet ray hardening resins, such as an acrylic, and heat hardening resins, such as an epoxy, are mixed.

A plurality of electrical wirings 32 is formed on the surface of the base insulator film 51. The electrical wirings 32 are formed in predetermined patterns with conductive materials, such as Ag. Meanwhile, an interlayer insulator film 52 is formed, on the surface of the base insulator film 51, on the area where no electrical wiring 32 is formed. The line/space of the electrical wirings 32 is refined, for example, to 30/30 μm by employing a droplet discharge system to be described later.

The interlayer insulator film 54 is formed in a manner of mainly covering the electrical wirings 32. The interlayer insulator film 54 is composed of the same resin material as that used for the base insulator film 51. A conductive post 34 with an appropriate height is formed, from a part of the electrical wirings 32, in a manner of piercing the interlayer insulator film 54. The conductive post 34 is formed with a columnar structure and composed of the same conductive materials as those used for the electrical wirings 32, such as Ag. Here, by way of example, the thickness of the electrical wirings 32 is about 2 μm and the height of the conductive post 34 is about 8 μm.

An upper layer electrical wiring 36 is formed on the surface of the interlayer insulator film 54. Like the lower layer electrical wirings 32, the upper electrical wiring 36 is also composed of conductive materials, such as Ag. As shown in FIG. 2A, the upper layer electrical wiring 36 may be placed so as to intersect with the lower layer electrical wirings 32. The upper layer electrical wiring 36 is connected to the top of the conductive post 34 to secure the conduction with the lower layer electrical wirings 32.

As shown in FIG. 2B, an interlayer insulator film 56 is formed on the area, on the surface of the interlayer insulator film 54, where the electrical wiring 36 is not formed. Further, an overcoat 58 is formed in a manner of mainly covering the electrical wiring 36. The interlayer insulator film 56 and the overcoat 58 are also composed of the same resin material as that used for the base insulator film 51.

Although the wiring pattern in the above described example has only two layers of electrical wirings 32 and 36, a wiring pattern may have electrical wirings with more than two layers. In such a case, the structure from the n-th layer electrical wiring to the n+1-th layer electrical wiring may be formed just in the same way as the structure from the first layer electrical wiring 32 to the second layer electrical wiring 36 is formed.

(A Method for Forming a Wiring Pattern)

Next, a method for forming a wiring pattern according to the embodiment will be described. FIG. 3 is an operation sheet of a method for forming a wiring pattern according to the embodiment. FIGS. 4A, 4B, and 4C and FIGS. 5A and 5B are diagrams explaining a method for forming a wiring pattern according to the embodiment. Now, each operation will be described in numerical order in the leftmost field of FIG. 3.

First, a surface of a film substrate 31 shown in FIG. 2B is cleaned (Step 1). Specifically, excimer UV at a wavelength of 172 nm is irradiated onto the surface of the film substrate 31 for about 300 seconds. The film substrate 31 may be also cleaned using solvents, such as water, or ultrasonic waves. It is also acceptable to clean the film substrate 31 by irradiating plasma onto the film substrate 31 at normal pressures.

Next, a bank (a peripheral part) for a base insulator film 51 is drawn and formed on the surface of the film substrate 31 as a preparatory step to form the base insulator film 51 on the surface of the film substrate 31 (Step 2). The drawing is done using a droplet discharge system (an inkjet system). Specifically, a resin material before hardened, which is a forming material of the base insulator film 51, is discharged along the peripheral part of the area for forming the base insulator film 51, by using a droplet discharge apparatus to be described later. Next, the discharged resin material is hardened (Step 3). Specifically, UV at a wavelength of 365 nm is irradiated onto the base insulator film 51 for about 4 seconds to harden a UV hardening resin, which is a forming material of the base insulator film 51. Thus, a bank is formed on the peripheral part of the area for forming the base insulator film 51.

Figure 4A:
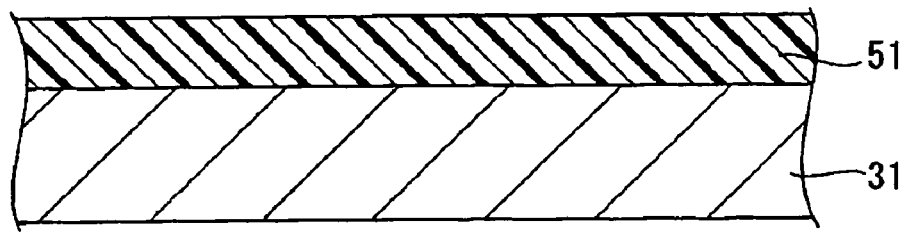
FIGS. 4A, 4B, and 4C are diagrams explaining a method for forming a wiring pattern according to the embodiment.

Next, a base insulator film 51 is drawn and formed within the resulting bank (Step 4). The drawing is also done using a droplet discharge system. Specifically, a droplet discharge head of a droplet discharge apparatus to be described later is scanned throughout the inside of the bank while a resin material before hardened, which is a forming material of the base insulator film 51, is discharged from the droplet discharge head. Here, the discharged resin material will not spread beyond the area for forming the base insulator film 51, because the discharged resin material is backed up at the bank on the peripheral part even in case where the discharged resin material flows. Next, the discharged resin material is hardened (Step 5). Specifically, UV at a wavelength of 365 nm is irradiated onto the base insulator film 51 for about 60 seconds to harden a UV hardening resin, which is a forming material of the base insulator film 51. Thus, a base insulator film 51 is formed on the surface of the film substrate 31, as shown in FIG. 4A.

Next, the contact angle on the surface of the base insulator film 51 is adjusted as a preparatory step to form an electrical wiring 32 on the surface of the base insulator film 51 (Step 6). As is described below, in the discharging of a droplet containing a forming material of an electrical wiring 32, too large contact angle on the surface of the base insulator film 51 causes the discharged droplet to become spherical, making it difficult to form an electrical wiring with a predetermined form and on a predetermined position. Meanwhile, too small contact angle on the surface of the base insulator film 51 causes the discharged droplet to spread out, making it difficult to refine an electrical wiring. Because the surface of the base insulator film 51 after hardened has a liquid repellency, the contact angle on the surface of the base insulator film 51 can be adjusted by irradiating excimer UV at a wavelength of 172 nm onto the surface for about 15 seconds. The modification degree of the liquid repellency can be adjusted not only with the irradiation time of the ultraviolet light but also with the combinations of intensity and wavelength of a ultraviolet light and a heat treatment (heating) and the like. As other methods for lyophilic treatment, there are treatments, such as a plasma treatment in which oxygen is used as a reaction gas and a treatment in which a substrate is exposed to ozone atmosphere.

Figure 4B:
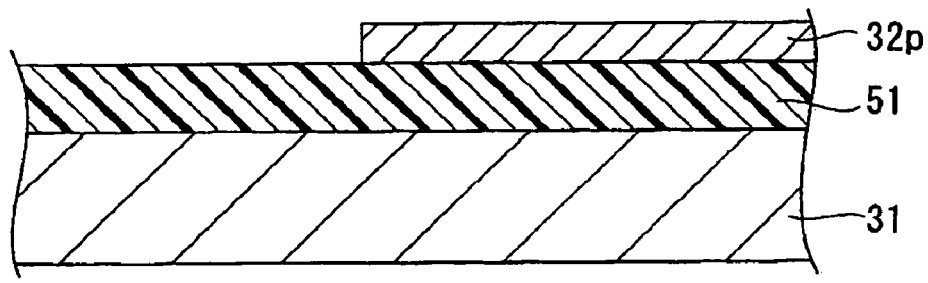

Next, as shown in FIG. 4B, a liquid line 32$p$, which will later become an electrical wiring, is drawn and formed on the surface of the base insulator film 51 (Step 7A). The drawing is done using a droplet discharge system that uses a droplet discharge apparatus to be described later. Here, a dispersion liquid in which conductive microparticles, which is a forming material of an electrical wiring, are dispersed in a dispersion medium is discharged. As conductive microparticles, silver is preferably used. In addition, metal microparticles that contain any of gold, copper, palladium, or nickel, and microparticles of conductive polymer or superconducting properties can be also used.

As for the conductive microparticles, the surfaces can be coated, for example, with organic matters for the purpose of improving the dispersibility. Polymer, which induces steric hindrance and electrostatic repulsion, for example, is an example of coating materials to be applied onto the surfaces of conductive microparticles. Further, it is preferable that the diameter of the conductive microparticles is in the range of 5 nm to 0.1 μm. This is because a particle that is greater than 0.1 μm in diameter easily causes the nozzles to be clogged, making the discharging from a droplet discharge head difficult. In the meanwhile, a particle that is smaller than 5 nm in diameter means a large volume proportion of the coating materials to the conductive microparticles, causing an excessively large proportion of the organic matters in the resulting electric conductor.

Dispersion media to be used are not particularly limited as long as the above-referenced conductive microparticles can be dispersed without causing coagulation. In addition to water, alcohols such as methanol, ethanol, propanol, and butanol, hydrocarbon compounds such as n-heptane, n-octane, decane, toluene, xylene, cymene, durene, indene, dipentene, tetrahydronaphthalene, decahydronaphthalene, and cyclohexylbenzene, ethers compounds such as ethylene glycol dimethyl ether, ethylene glycol diethyl ether, ethylene glycol methyl ethyl ether, diethyleneglycol dimethyl ether, diethylene glycol diethyl ether, diethylene glycol methyl ethyl ether, 1,2-dimethoxyethane, Bis (2-methoxyethyl) ether, and p-dioxane, and polar compounds such as propylene carbonate, gamma-butyrolactone, N-methyl-2-pyrrolidone, dimethylformamide, dimethyl sulfoxide, and cyclohexanone are acceptable. Among these, water, alcohols, hydrocarbon compounds, and ethers compounds are preferable in terms of the dispersibility of particles, the stability of a dispersion liquid, and the applicability to a droplet discharge system. In particular, water and hydrocarbon compounds are specifically preferable dispersion media. These dispersion media can be used as a mixture of more than two kinds of materials as well as by itself.

As for dispersion media for a droplet containing conductive microparticles, it is preferable that its steam pressure at room temperature is in the range of 0.001 mmHg to 200 mmHg (that is, in the range of about 0.133 Pa to 26600 Pa). This is because a dispersion medium, in the case where the steam pressure is higher than 200 mmHg, evaporates too quickly after the discharging, making it difficult to form a good electric conductor. Further, the steam pressure of dispersion media is preferable in the range of 0.001 mmHg to 50 mmHg (that is, in the range of about 0.133 Pa to 6650 Pa). This is because a nozzle, in the case where the steam pressure is higher than 50 mmHg, is easily clogged due to dryness in the discharging of droplets using a droplet discharge system, making a stable discharging difficult. In the meanwhile, in the case where the steam pressure of a dispersion medium is lower than 0.001 mmHg at room temperature, the dispersion medium evaporates too slowly and is inclined to remain in the electric conductor, making it difficult to get a good electric conductor after a heat treatment and/or a light treatment, which will be done as post-processes.

The dispersoid concentration in dispersing the conductive microparticles into a dispersion medium may be in the range of 1 mass percent to 80 mass percent, and can be adjusted according to a desired thickness for an electric conductor. When the concentration surpasses 80 mass percent, the dispersion liquid is prone to coagulation, which makes it difficult to get a uniform electric conductor.

It is preferable that the surface tension of the dispersion liquid for the conductive microparticles is in the range of 0.02 N/m to 0.07 N/m. This is because when the surface tension is smaller than 0.02 N/m in discharging a droplet in a droplet discharge system, the wetting property of the ink composition toward the nozzle surface increases and induces jet deflection, while when the surface tension is greater than 0.07 N/m, the form of the meniscus on the top of the nozzles is unstable and makes it difficult to control a rate and a timing of discharging. To adjust a surface tension, a minute amount of surface tension regulants, such as fluorine-containing compounds, silicon-containing compounds, and nonion-containing compounds, can be added to the dispersion liquid within the limits of not lowering unreasonably the contact angle with the base insulator film 51. Nonion-containing surface tension regulants improves the wetting property toward the base insulator film 51 and the leveling of the film, and is effective in preventing the occurrence of jaggies and orange peels and the like on the coating film. The dispersion medium may, if necessary, include organic compounds, such as alcohol, ether, ester, and ketone.

It is preferable that the viscosity of the dispersion medium is in the range of 1 mPa·s to 50 mPa·s. This is because when the viscosity is smaller than 1 mPa·s in discharging a droplet in a droplet discharge system, the peripheral part of a nozzle is easily polluted with the ink flowage, while when the viscosity is greater than 50 mPa·s the nozzle aperture is more frequently clogged, making it difficult to discharge a droplet smoothly.

According to the embodiment, a droplet (a first droplet) of the dispersion liquid is discharged from a droplet discharge head onto a position on which an electrical wiring to be formed. In the discharging, it is preferable to adjust the overlapping of droplets to be discharged in succession so as to prevent the occurrence of bulge. Specifically, it is preferable to use a discharging method in which a plurality of droplets is discharged, in a first discharging, at certain intervals so as not to touch each other, and then the intervals are filled in during the subsequent dischargings. A liquid line 32p is formed on the surface of the base insulator film 51, following the steps described above.

Next, the liquid line 32p is preliminarily dried (Step 7B). The preliminary drying is done so that at least the surface of the liquid line 32p is dried. Specifically, a dry air, such as an air with low moisture or an inert gas, is insufflated toward the liquid line 32p. The temperature of the dry air may be ordinary temperature (about 25 degrees centigrade) or higher temperature. Further, instead of insufflating a dry air, infrared radiation may be irradiated onto the liquid line 32p using infrared lamp or the like. Thus, because the preliminary drying can be done with simple manufacturing facilities and simple manufacturing processes by using an insufflating of a dry air or an irradiating of infrared radiation as a specific way for the preliminary drying, the increases of the facilities cost and the manufacturing cost can be suppressed. Further, the manufacturing time can be shortened because the temperature can be turned back quickly to the ordinary temperature even if the preliminary drying causes an increase in temperature.

Figure 4C:
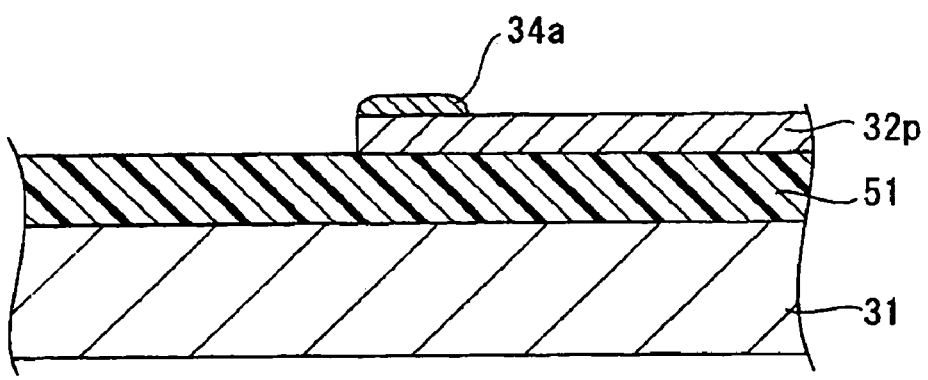

Next, as shown in FIG. 4C, a liquid subpost 34a, which will be a conductive post, is drawn and formed on a part of the preliminarily dried liquid line 32p (Step 8A). The drawing is done using a droplet discharge system that uses a droplet discharge apparatus to be described later, just like the drawing of a liquid line 32p in Step 7A. Here, a droplet (a second droplet) of the dispersion liquid in which conductive microparticles, which is a forming material of an electrical wiring, are dispersed in an dispersion medium is discharged. Specifically, the droplet is the same as the droplet (the first droplet) of a liquid matter that is used for the drawing of the liquid line 32p. That it to say, a liquid matter can be discharged, after the liquid line 32p is drawn, onto a conductive post forming position using the same droplet discharge head.

As described above, a conductive post needs to be formed with an appropriate height. Therefore, plenty of droplets need to be discharged and piled up by a droplet discharge system to form a liquid post with an appropriate height. However, discharging plenty of droplets at a time is not sufficient to achieve a needed height for a liquid post. Rather, there is a possibility that it generates a liquid post that is too large in diameter, causing a short circuit between adjacent electrical wirings or conductive posts. Thus, the droplets are discharged in multiple divided times. Further, in a single discharging of a droplet, a liquid subpost with a lower height than the needed height for the liquid post is formed. For example, about ten drips of droplets are discharged at one time to first draw and form a first layer liquid subpost 34a.

Next, the liquid subpost 34a is preliminarily dried (Step 8B). The preliminary drying is done so that at least the surface of the liquid subpost 34a is dried. Specifically, it is preferable to use an insufflating of a dry air or an irradiating of infrared radiation, just like in the preliminary drying of a liquid line in Step 7B.

Figure 5A:
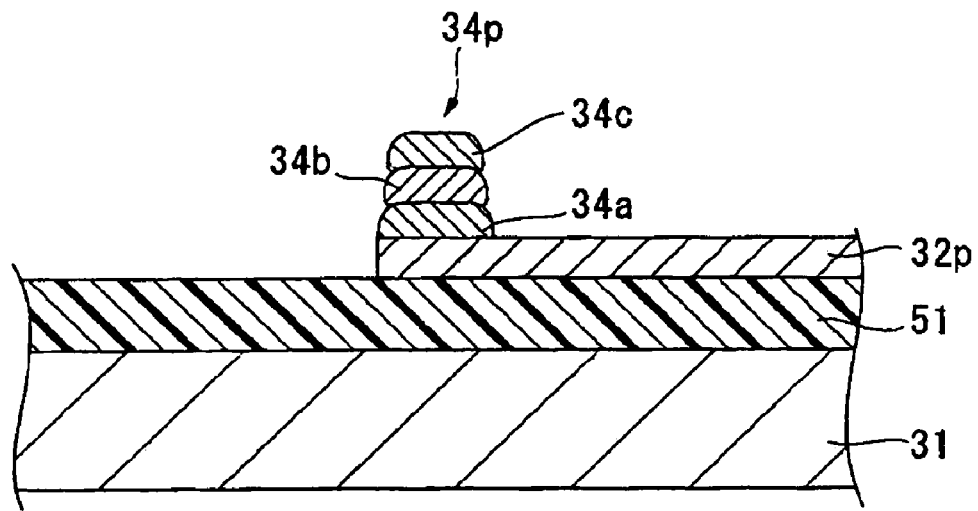
FIGS. 5A and 5B are diagrams explaining a method for forming a wiring pattern according to the embodiment.

Then, Steps 8A and 8B are repeatedly done (Step 9). As described above, the first layer liquid subpost 34a has been preliminarily dried, a new droplet can be discharged on the surface without spreading out on the surface of the base insulator film 51. Therefore, a second layer liquid subpost 34b can be formed on the first layer liquid subpost 34a, as shown in FIG. 5A, by discharging another about ten drips of droplets. Thus, by repeating Steps 8A and 8B, a plurality of liquid subposts 34a, 34b, and 34c is laminated to form a liquid post 34p with an appropriate height.

Figure 6:
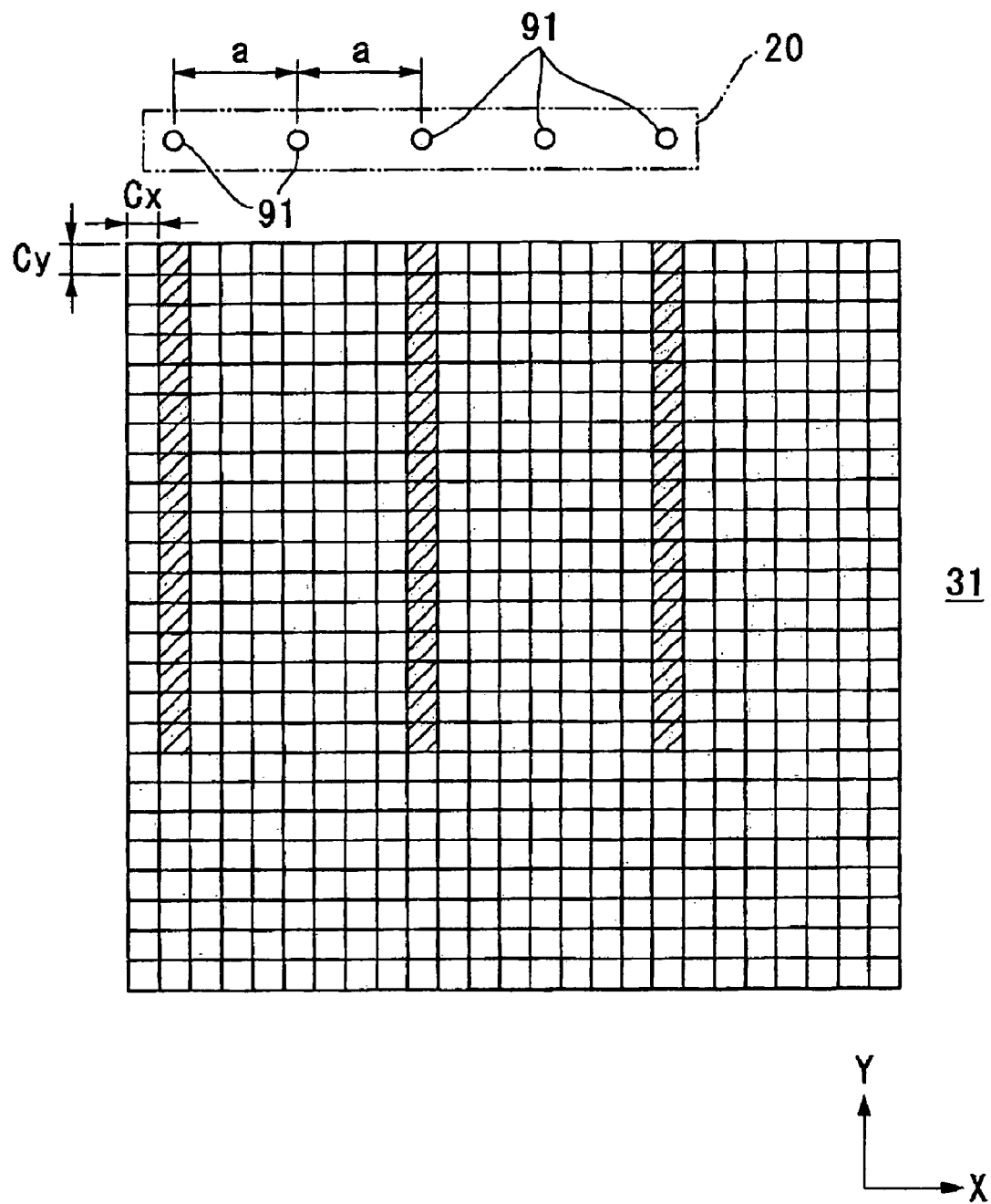
FIG. 6 is a pattern diagram showing an example of an allocation of droplets in discharging a droplet onto a surface of a substrate.

FIG. 6 is a typical example of an allocation of droplets in the discharging of droplets onto a surface of a substrate (a film substrate 31). As shown in FIG. 6, in the example, a droplet discharge head 20 (hereinafter, simply referred to as a "head") having a plurality of nozzles 91 and the substrate 31 are moved relatively in a predetermined direction (in the Y direction) while discharging droplets from predetermined nozzles among the plural nozzles 91 to place droplets onto the substrate 31.

On the substrate 31, a bitmap is set up, composed of a plurality of unit areas (pixels) that is subdivided in a lattice pattern for locating a droplet discharging position. The setting up of the bitmap is done ahead of the droplet discharging process.

As shown in FIG. 6, the shape of a pixel (a unit area) is set to be square. Specifically, the width of a pixel in the X direction "cx" and the width of a pixel in the Y direction "cy" are set to be the same.

The plural nozzles 91 are placed on a head 20 in the X direction at certain intervals. Each of the plural nozzles 91 is placed along the X direction.

Here, in the example, the width of a pixel "cx" (=cy) is set to be smaller than the interval among nozzles "a". Further, in the setting of the bitmap, the width of a pixel in the X direction "cx" is set in a manner of satisfying the equation "c=a/n" ("n" is a positive integer). In the example in FIG. 6, "n" is set to be 4.

A straight coated film (a liquid line) can be formed by placing droplets, for example, on each of the pixels that are drawn with hatching in FIG. 6. Here, the droplets can be placed one by one in turn on each of the plural pixels that are placed in the direction of the relative movement (in the Y direction) or by repeating the placing of the droplets at certain intervals. Placing the droplets at certain intervals suppresses the excessive spreading out of the liquid matter, preventing the occurrence of so-called bulge.

The degree of the spreading out of the droplets placed on the substrate 31, which is the diameter of the droplets immediately after being discharged on the substrate 31, depends on the properties of the liquid materials and the surface of the substrate. The spreading out of the droplets is taken into consideration in a pattern design for forming a wiring pattern. Further, the degree of the spreading out of the droplets on the substrate 31 depends deeply on the contact angle on the substrate 31 and the droplets. Therefore, the spreading out of the droplets (the diameter of the droplets immediately after being discharged) can be controlled by deploying surface treatments, such as a lyophilic treatment and a repellency treatment, depending on the properties of the liquid material, onto the substrate 31 to control the contact angle.

Figure 7:
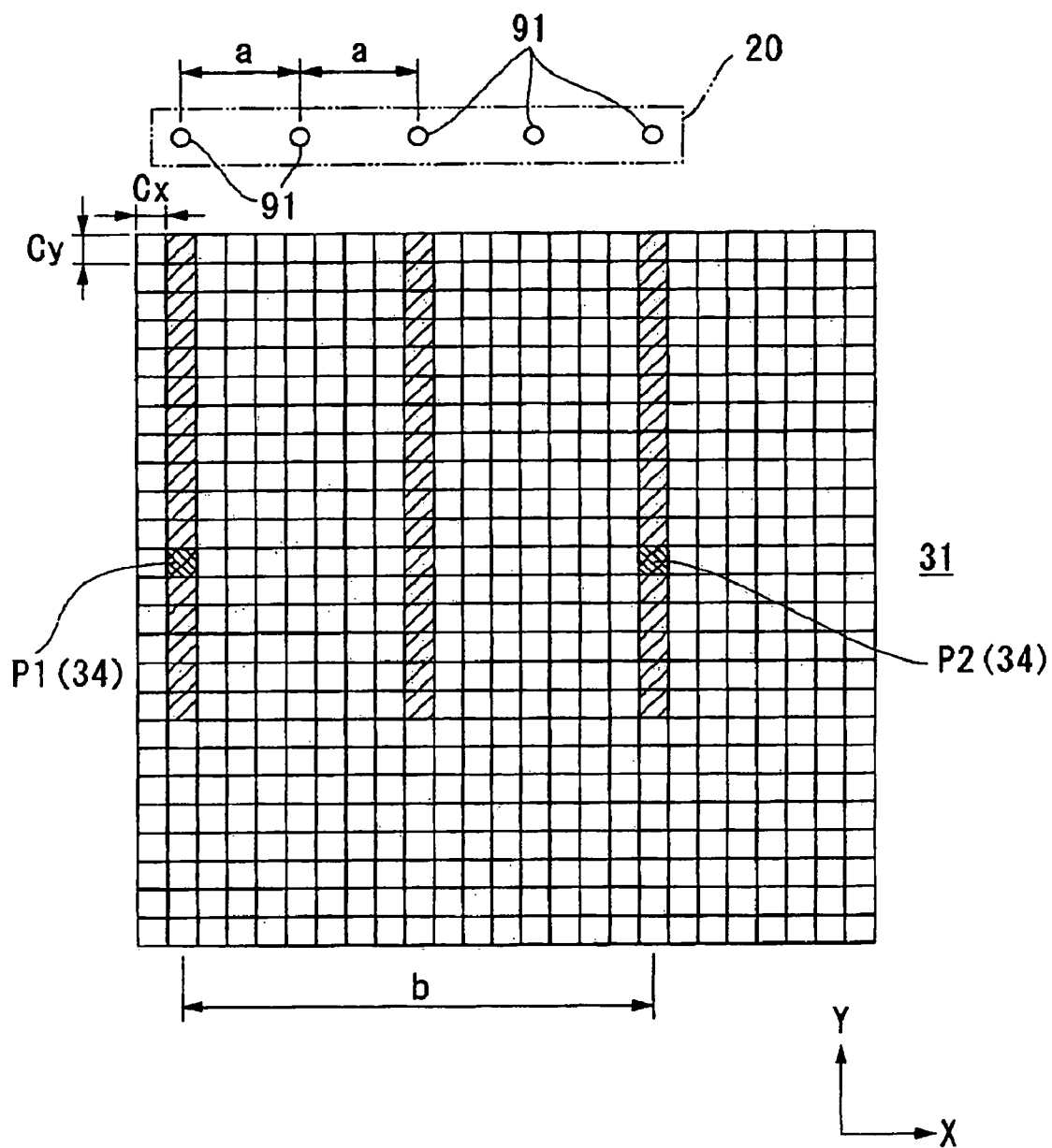
FIG. 7 is a pattern diagram showing an example of an allocation of droplets in forming a conductive post.

FIG. 7 is a typical example of an allocation of droplets in the forming of a conductive post 34 (refer to FIG. 5A). P1 and P2 in FIG. 7 are conductive post forming positions, respectively. The widths of a pixel "cx" and "cy" and the intervals among a plurality of nozzles "a" and the like in the bitmap are the same as those in FIG. 6.

As shown in FIG. 7, the interval "b" between the conductive post forming positions P1 and P2 is set to be wider than the intervals among nozzles "a" in the example. More specifically, the interval between posts "b" and the width of a pixel in the X direction "cx" (="cy") is set in a manner of satisfying the equation "b=m×a" ("m" is a positive integer). In the example in FIG. 7, "m" is set to be 16.

By repeating the placing of droplets and the preliminary drying of the placed droplets, for example, onto the conductive post forming positions P1 and P2, respectively, as shown in FIG. 7, a conductive post 34 with an appropriate height 34, as shown above in FIG. 5A, can be formed respectively on the positions P1 and P2.

According to the example, the droplet discharge process can be simplified due to the requirement that the interval "b" between the positions to form a plurality of conductive posts P1 and P2 is equal to integral multiples of the width "a" of a plurality of nozzles 91. Specifically, due to the requirement, once a conductive post forming position P1 is placed on the moving axis of one of the plural nozzles 91 during the relative movement of the head 20 and the substrate 31, another conductive post forming position P2 is also placed on another moving axis of another nozzle. Therefore, droplets can be placed on each of the conductive post forming positions P1 and P2 during a single relative movement. As a result, there occurs little waste in the relative movement, which simplifies the droplet discharge process.

The relative movement of the head 20 and the substrate 31 with little waste suppresses the increase of processing time involved with the repeating of droplets discharging. It makes more sense particularly in the forming of conductive posts because droplets are placed repeatedly on the conductive post forming positions P1 and P2 so as to get an appropriate height. Thus, the throughput is improved and the wiring pattern forming cost can be lowered.

Next, referring to FIG. 5A once again, the liquid line 32p and the liquid post 34p are fully baked (Step 10). The liquid line 32p and the liquid posts 34a, 34b, and 34c, which are already dried preliminarily during the precedent steps, are fully baked simultaneously. Specifically, the film substrate 31 on which the liquid line 32p and the liquid post 34p are formed is heated on a hot plate at a temperature of 150 degrees centigrade for about 30minutes.

Although the full baking is done in the ordinary air, it can also be done, if necessary, in inert gases atmosphere, such as nitrogen, argon, and helium. Further, although the temperature of the full baking is, here, set to be 150 degrees centigrade, it is preferable to set the temperature taking into consideration the boiling point (steam pressure) of the dispersion medium included in the liquid line 32p and the liquid post 34p, the type and the pressure of the atmosphere gases, thermal behaviors of the particles, such as dispersibility and oxidativity, the presence and the amount of a coating material, and a heat resistance of the substrate.

The baking process can be done not only by using an ordinary hot plate or an electric furnace but also by using a lamp anneal. As a light source to be used for a lamp anneal, although it is not limited particularly, infrared lamp, xenon lamp, YAG laser, argon laser, carbon dioxide laser, and excimer laser such as XeF, XeCl, XeBr, KrF, KrCl, ArF, and ArCl can be used. Although these light sources are generally used with the output power in the range of 10 W to 5000 W, the range of 100 W to 1000 W is sufficient in the embodiment.

Figure 5B:
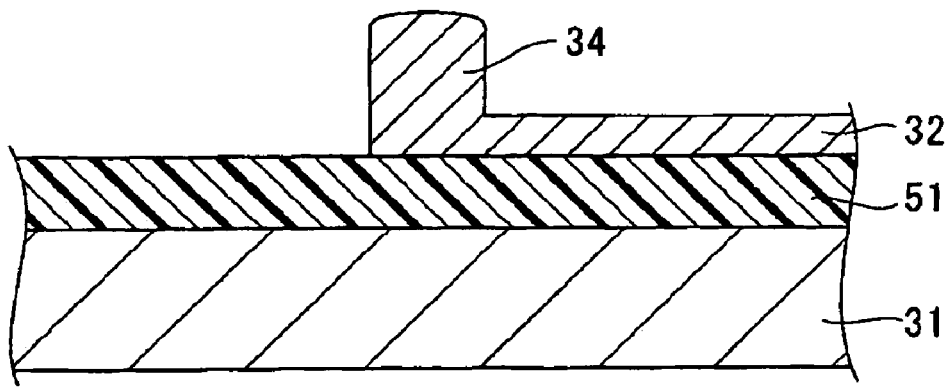

After the full baking, the dispersion medium contained in the liquid line 32p and the liquid post 34p is volatilized, securing an electrical connection between the conductive microparticles. Thus, as shown in FIG. 5B, the liquid line 32p and the liquid post 34p are formed.

Next, as shown in FIG. 2B, the contact angle on the surface of the base insulator film 51 is adjusted as a preparatory step to form an interlayer insulator film 52 on the formative layer of the electrical wiring 32 (Step 11). As the hardened surface of the base insulator film 51 has a liquid repellency, excimer UV at a wavelength of 172 nm is irradiated onto the surface to add a lyophilic property.

Next, an interlayer insulator film 52 is drawn and formed around the electrical wiring 32 (Step 12). The drawing is done using a droplet discharge system, just like the drawing of a base insulator film 51. Here, if a resin material, which is a forming material of the interlayer insulator film 52, is discharged in a way that it contacts with the conductive post 34, there is a possibility that the resin material wetly mounts on the top of the conductive post 34, making the conductive connection with the upper layer electrical wiring 36 impossible. Therefore, a void is placed around the conductive post 34 and around the electrical wiring 32, and the resin material is discharged outside of the voids.

Next, excimer UV at a wavelength of 172 nm is irradiated onto the voids around the conductive post 34 and around the electrical wiring 32 as a lyophilic treatment (Step 13). Thus, a lyophilic property is added to the voids around the conductive post 34 and around the electrical wiring 32, letting the resin material flow into the voids and contact with the conductive post 34 and the electrical wiring 32. Here, the resin material wetly mounts on the surface of the electrical wiring 32, but not on the top of the conductive post 34. Therefore, conduction can be secured between the conductive post 34 and the upper layer electrical wiring 36. Then, the discharged resin material is hardened (Step 14). Specifically, UV at a wavelength of 365 nm is irradiated to harden a UV hardening resin, which is a forming material of an interlayer insulator film 52. Thus, an interlayer insulator film 52 is formed.

Next, an interlayer insulator film 54 is drawn and formed mainly on the surface of the electrical wiring 32 (Step 15). The drawing is done using a droplet discharge system, just like the drawing of a base insulator film 51. Here again, it is preferable that a resin material is discharged after a void is placed around the conductive post 34. Next, the discharged resin material is hardened (Step 16). Specifically, UV at a wavelength of 365 nm is irradiated for about 60 seconds to harden a UV hardening resin, which is a forming material of an interlayer insulator film 54. Thus, an interlayer insulator film 54 is formed.

Next, an upper layer electrical wiring 36 is formed on the surface of the interlayer insulator film 54. The specific processes are the same with those in Step 6 to Step 10 for forming a lower layer electrical wiring 32. Then, an interlayer insulator film 56 is formed on the formative layer of the electrical wiring 36. The specific processes are the same with those in Step 11 to Step 14 for forming an interlayer insulator film 52 on the formative layer of the electrical wiring 32. Further, by doing Step 15 and Step 16, an interlayer insulator film can be formed on the surface of the upper layer electrical wiring 36.

By repeating the processes in Step 6 to Step 16, electrical wirings can be deposited. On the surface of the top layer of the electrical wirings, it is preferable to form an overcoat 58 using the same processes in Step 15 and Step 16. In this way, a wiring pattern of the embodiment shown in FIG. 2 is formed.

As described above, the method for forming a wiring pattern of the embodiment includes: drawing and forming a liquid line by a droplet discharge system (Step 7A), preliminarily drying the surface of the liquid line (Step 7B), drawing and forming a liquid post on a part of the liquid line by a droplet discharge system (Step 8A), and fully baking the liquid line and the liquid post (Step 10). According to the configuration, as a liquid post is drawn and formed on a surface of a liquid line which has been preliminarily dried, the liquid post and the liquid line can be coalesced on the interface. Then, by baking the liquid line and the liquid post simultaneously, electrical wirings and conductive posts can be formed integrally. Thus, the occurrence of cracks on the interface between the electrical wirings and the conductive posts can be prevented, making it possible to form a good wiring pattern that has highly reliable conductive connection.

The method for forming a wiring pattern of the embodiment further includes: drawing and forming a liquid subpost by a droplet discharge system (Step 8A), preliminarily drying the surface of the liquid subpost (Step 8B), repeating of Steps 8A and 8B (Step 9), and fully baking the multilayered liquid subposts (Step 10). According to the configuration, as the forming of a liquid subpost by a droplet discharge and the preliminary drying of the subpost are repeatedly done, the discharged droplet will not spread out on the flat surface, making it possible to deposite the liquid subposts. Then, by fully baking simultaneously the liquid subposts that have been preliminarily dried and deposited, a conductive post with an appropriate height can be formed.

Further, because the method for forming a wiring pattern of the embodiment adopts a droplet discharge system for the forming of electrical wirings, conductive posts, and all kinds of insulating films, the yield rate can be improved and the manufacturing cost can be suppressed. Further, wiring patterns can be multilayered and refined. The width of a plurality of electrical wirings (line/space) can be refined, for example, from 50/50 μm, as is usual, to 30/30 μm. Thus, FPC can be downsized, and eventually electro-optic devices and electronic apparatuses using the FPC can also be downsized.

Although the method for forming a wiring pattern for FPC is described in the embodiment as an example, the invention is also applicable as a method for forming a wiring pattern on a hard substrate. In addition, although the method for forming a conductive post on an electrical wiring is described in the embodiment, the invention also includes the forming of a conductive post on an electrode land of an electrical wiring.

(A Droplet Discharge Apparatus)

Figure 8:
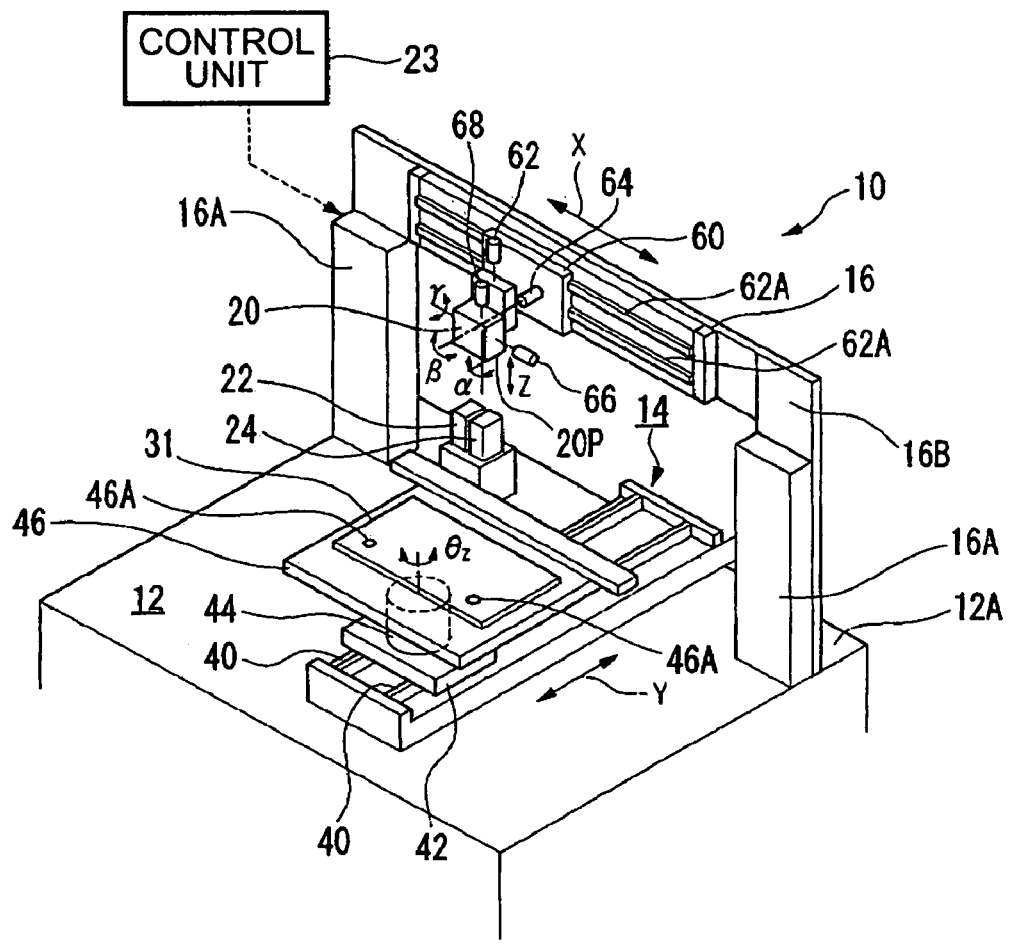
FIG. 8 is an oblique diagram of a droplet discharge system.
Figure 9:
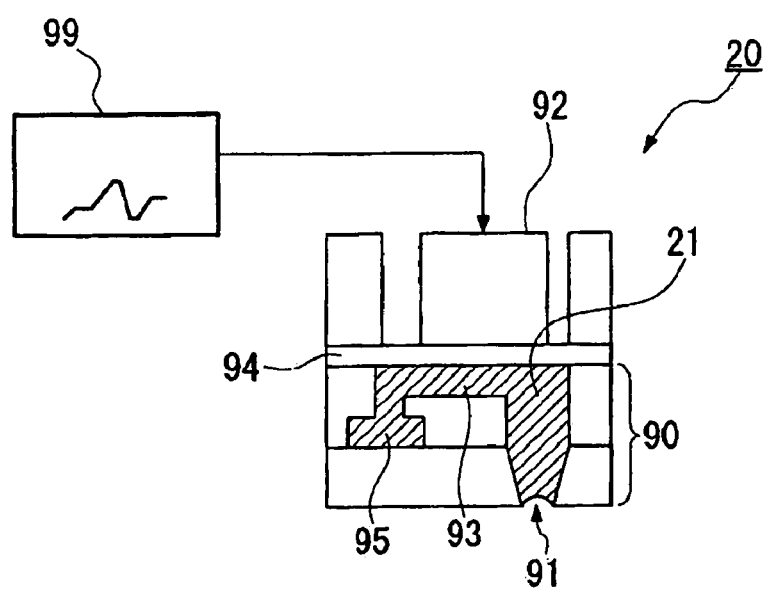
FIG. 9 is a sectional view of a droplet discharge head.

Next, a droplet discharge apparatus will be described with reference to FIGS. 8 and 9. FIG. 8 is an oblique diagram of a droplet discharge apparatus. In FIG. 8, the X direction is a horizontal direction of a base 12, the Y direction is a cross direction, and the Z direction is a vertical direction. The droplet discharge apparatus 10 is mainly composed of a droplet discharge head (hereinafter, simply referred to as a "head") 20 and a table 46 on which to place a substrate 31. The operation of the droplet discharge apparatus 10 is controlled by a control unit 23.

The table 46 on which to place the substrate 31 can be moved and aligned in the Y direction with a first movement unit 14, and can be oscillated and aligned in the θz direction with a motor 44. Meanwhile, the table 46 can be moved and aligned in the X direction with a second movement unit, and can be moved and aligned in the Z direction with a linear motor 62. Further, the head 20 can be oscillated and aligned in the α, β, and γ directions, respectively with the motors 64, 66, and 68. Thus, the droplet discharge apparatus 10 can control precisely the relative position and posture of an ink discharge surface 20p of the head 20 and the substrate 31 on the table 46.

Here, a constructional example of the head 20 will be described with reference to FIG. 9. FIG. 9 is a sectional view of a droplet discharge head. The head 20 discharges an ink 21 from a nozzle 91 by a droplet discharge system. As a droplet discharge system, publicly known various technologies can be applied, such as piezo method in which an ink is discharged using piezo element as a piezoelectric element, or a method in which an ink is discharged in the form of a bubble that is generated by heating the ink. Among these methods, the piezo method has advantages, such as that the composition of an ink is not affected because no heat is added to the ink. Thus, the piezo method is adopted for the head 20 in FIG. 9, A main body 90 of the head 20 includes a reservoir 95 and a plurality of ink rooms 93 that is divaricated from the reservoir 95. The reservoir 95 serves as a flow channel to supply an ink into each of the ink rooms 93. On the bottom surface of the main body 90 of the head, a nozzle plate is attached, composing an ink discharge surface. On the nozzle plate, a plurality of nozzles 91 for discharging an ink is opened toward each of the corresponding ink rooms. Then, an ink flow channel is formed toward the corresponding nozzle 91 form each of the ink rooms 93. Meanwhile, a diaphragm 94 is attached on the top surface of the main body 90 of the head. The diaphragm 94 composes the wall surfaces of each of the ink rooms 93. Outside of the diaphragm 94, a piezo element 92 is placed accordingly to each of the ink rooms 93. The piezo element 92 is composed of a piezo material, such as a crystal, that is interposed with a pair of electrodes (not shown). The pair of electrodes are connected to a drive circuit 99.

Further, the piezo element 92 is transformed expandedly or constrictedly when voltage is applied from the drive circuit 99 to the piezo element 92. When the piezo element 92 is transformed constrictedly, the pressure in the ink room 93 is lowered, causing the ink 21 to flow into the ink room 93 from the reservoir 95. Meanwhile, when the piezo element 92 is transformed expandedly, the pressure in the ink room 93 is increased, causing the ink 21 to be discharged from the nozzle 91. The transformation degree of the piezo element 92 can be controlled by changing the applied voltage. The transformation speed of the piezo element 92 can be controlled by changing the frequency of the applied voltage. Specifically, the discharging condition of the ink 21 can be controlled by controlling the voltage to be applied onto the piezo element 92.

A capping unit 22 shown in FIG. 8 caps the ink discharge surface 20P when the droplet discharge apparatus 10 is on standby to prevent the drying of the ink discharge surface 20P of the head 20. A cleaning unit 24 sucks the inside of nozzles so as to clear away clogging in the nozzles on the head 20. The cleaning unit 24 is also capable of wiping the ink discharge surface 20P so as to clear away smudges on the ink discharge surface 20P of the head 20.

(An Electro-Optic Device)

In the embodiment, a wiring pattern formed on FPC is described as an example. A liquid crystal module will now be described with reference, once again, to FIG. 1, as an example of electro-optic devices that adopt the FPC. FIG. 1 is an exploded oblique diagram of a liquid crystal module with a COF (Chip On Film) structure. The liquid crystal module 1 mainly includes a liquid crystal panel 2 for color display, FPC 30 that is connected to the liquid crystal panel 2, and a liquid crystal driving IC 100 that is mounted on FPC 30. Further, a lighting system, such as a backlight, and other accompanying devices are attached to the liquid crystal panel 2, if necessary.

The liquid crystal panel 2 includes a pair of substrates 5a and 5b, that are attached each other with a seal material 4. A liquid crystal is inserted into a void, so-called cell gap, between the substrates 5a and 5b. In other words, the liquid crystal is interposed with the substrates 5a and 5b. The substrates 5a and 5b are generally composed of translucent materials, such as glass and synthetic resin. A deflecting plate 6a is attached on the outside surface of the substrates 5a and 5b.

An electrode 7a is formed on the inside surface of the substrate 5a while an electrode 7b is formed on the inside surface of the substrate 5b. The electrodes 7a and 7b are composed, for example, of translucent materials, such as ITO (Indium Tin Oxide). The substrate 5a has an overhanging part to the substrate 5b, a plurality of terminal posts 8 being formed on the overhanging part. The terminal posts 8 are formed together with an electrode 7a when the electrode 7a is formed on the substrate 5a. Therefore, the terminal posts 8 are formed, for example, with ITO. Among the terminal posts 8, some outlie directly from the electrode 7a and others are connected to the electrode 7b via a conductive material (not shown).

Meanwhile, on the surface of FPC 30, wiring patterns 39a and 39b are formed by the method for forming a wiring pattern according to the embodiment. Specifically, an input wiring pattern 39a is formed from one side of FPC 30 toward the center, while an output wiring pattern 39b is formed from the opposite side of FPC 30 toward the center. Electrode pads (not shown) are formed on the other sides, which are closer to the center, of the input wiring pattern 39a and the output wiring pattern 39b.

A liquid crystal driving IC 100 is mounted on the surface of FPC 30. Specifically, a plurality of bump electrodes that are formed on the active surface of the liquid crystal driving IC 100 is connected to the plural electrode pads that are formed on the surface of FPC 30 via ACF (Anisotropic Conductive Film) 160. The ACF 160 is formed by dispersing a plurality of conductive particles into an adhesive resin, which has thermoplasticity or thermosetting property. Thus, a so-called COF structure is achieved by fitting a liquid crystal driving IC 100 on the surface of FPC 30.

Then, FPC 30 having the liquid crystal driving IC 100 is connected to the substrate 5a of the liquid crystal panel 2. Specifically, an output wiring pattern 39b of FPC 30 is connected electrically to the terminal posts 8 on the substrate 5a via ACF 140. Here, space saving can be achieved by folding because FPC 30 is flexible.

In a liquid crystal module 1 configured according to the method described above, a signal is input into a liquid crystal driving IC 100 via an input wiring pattern 39a on FPC 30. Then, a driving signal is output to the liquid crystal panel 2 via an output wiring pattern 39b on FPC 30. Thus, an image is displayed on the liquid crystal panel 2.

In addition to devices that have an electro-optic effect that changes transmissivity of light by changing the refraction factor of materials by electric field, devices that transform electric energy into optical energy are also electro-optic devices. Specifically, the invention is widely applicable not only for liquid crystal display devices but also for luminescent devices, such as organic EL (Electro-Luminescence) devices, inorganic EL devices, plasma display devices, electrophoretic display devices, and display devices using electron emission elements (such as Field Emission Display and Surface-Conduction Electron-Emitter Display). For example, FPC having a wiring pattern according to the invention can be connected to an organic EL panel to compose an organic EL module.

(An Electronic Apparatus)

Figure 10:
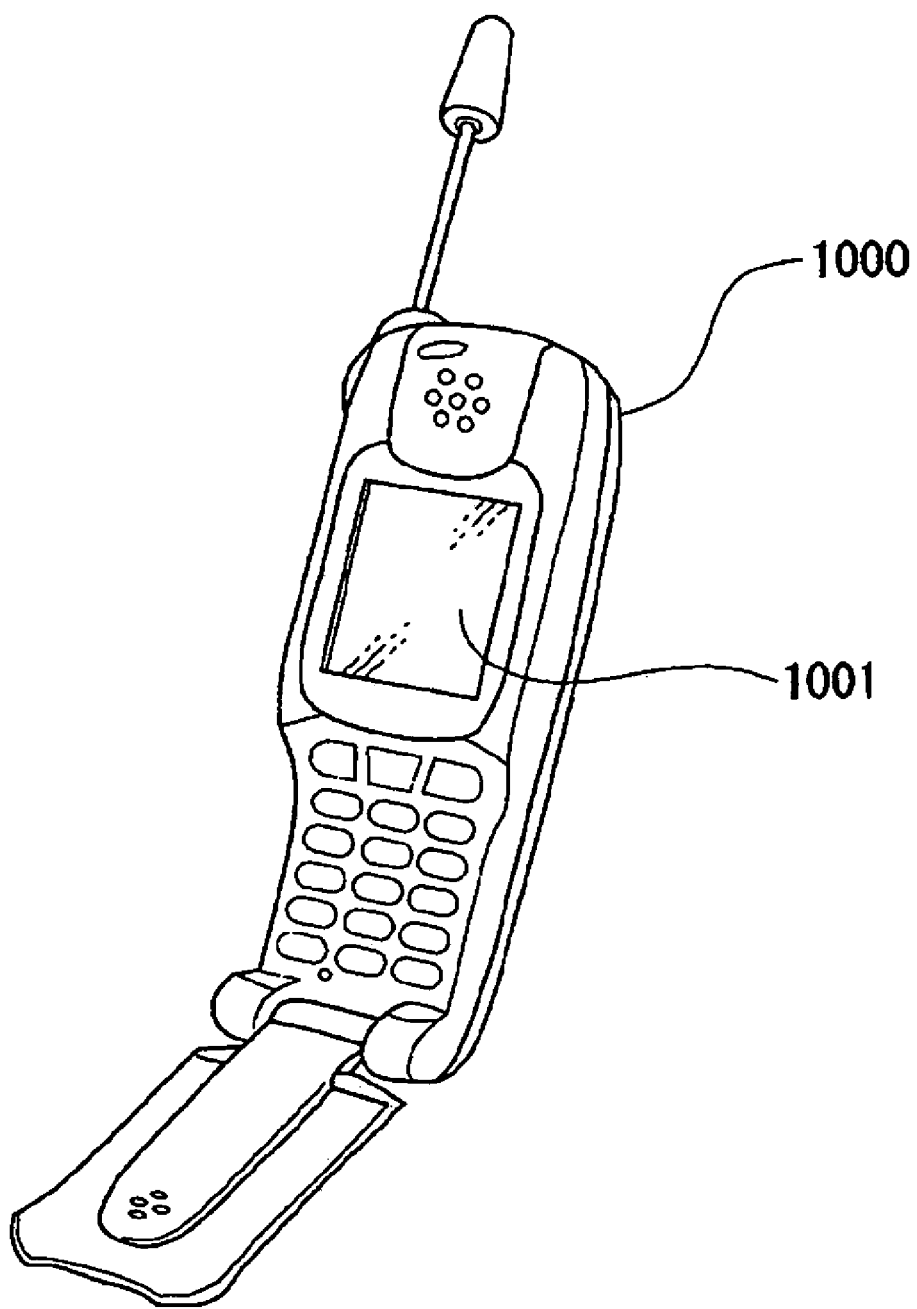
FIG. 10 is an oblique diagram of a cellular phone.

Next, an electronic apparatus manufactured using a wiring pattern of the embodiment will be described with reference to FIG. 10. FIG. 10 is an oblique diagram of a cellular phone. In FIG. 10, the number 1000 indicates a cellular phone, and the number 1001 indicates a display part. An electro-optic device having a wiring pattern of the embodiment is adopted to the display part 1001 of the cellular phone 1000. Therefore, a small cellular phone 1000 that has a highly reliable electrical connection can be provided. The invention can be used as an image displaying method, not only for the above-referenced cellular phone but also for electronic apparatuses, such as electronic books, personal computers, digital still cameras, liquid crystal televisions, video tape recorders (viewfinder types or monitor types), car navigation systems, pagers, electronic organizers, desktop calculators, word processors, workstations, videophones, POS terminals, and touch panels. In any case, a small electronic apparatus that has a highly reliable electrical connection can be provided.

The technology range of the invention is not limited to the above-referenced embodiments, but may include the embodiments in which various changes are added to the above-referenced embodiments within the limits of not deviating from the purposes of the invention. Specifically, the specific materials and configurations described above in the embodiments are only the examples and changes are supposed to be added.

What is claimed is:

1. A method for forming a wiring pattern in which a plurality of electrical wirings deposited onto a substrate is conductively connected with each other through a plurality of conductive posts, the method comprising:

forming the plurality of electrical wirings on the substrate;

forming the plurality of conductive posts by relatively moving a discharge head having a plurality of nozzles and the substrate in a predetermined direction while discharging droplets from predetermined nozzles among the plurality of nozzles directly on the plurality of electrical wirings;

wherein, in the orthogonal direction of the above-referenced predetermined direction, the interval among the plurality of nozzles "a" and the interval among the plurality of conductive posts "b" satisfy an equation "b=m× a,"

"m" being any positive integer.

2. The method for forming a wiring pattern according to claim 1, the method further comprising:

setting up on the substrate a plurality of unit areas that is subdivided in a lattice pattern for locating a droplet discharge position, wherein the unit areas are set up so that, in the orthogonal direction of the above-referenced predetermined direction, the interval among the plurality of nozzles "a" and the width of the unit area "c" satisfy an equation "$c=a/n$", "n" being any positive integer.

3. The method for forming a wiring pattern according to claim 1, wherein the plurality of conductive posts are formed by repeating the discharging of droplets and then drying the droplets.

4. The method for forming a wiring pattern according to claim 3, the forming of the plurality of electrical wirings by forming liquid lines on the substrate, the plurality of conductive posts being formed directly on the liquid lines.

\* \* \* \* \*

UNITED STATES PATENT AND TRADEMARK OFFICE
CERTIFICATE OF CORRECTION

PATENT NO. : 7,629,019 B2  Page 1 of 1
APPLICATION NO. : 11/196319
DATED : December 8, 2009
INVENTOR(S) : Sakurada et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1161 days.

Signed and Sealed this

Second Day of November, 2010

David J. Kappos
*Director of the United States Patent and Trademark Office*